(12) United States Patent
Matsushita

(10) Patent No.: US 6,836,073 B2
(45) Date of Patent: Dec. 28, 2004

(54) SIMULTANEOUS DISCHARGE APPARATUS

(75) Inventor: Atsushi Matsushita, Kanagawa (JP)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 0 days.

(21) Appl. No.: 10/452,261

(22) Filed: Jun. 2, 2003

(65) Prior Publication Data
US 2003/0227259 A1 Dec. 11, 2003

(30) Foreign Application Priority Data
Jun. 10, 2002 (JP) .......................... 2002-168260

(51) Int. Cl.⁷ .............................. H01J 7/24; C23C 16/00
(52) U.S. Cl. .............................. 315/111.51; 315/111.41; 315/111.21; 118/723 E; 118/723 R
(58) Field of Search .......................... 315/111.51, 111.71, 315/111.41, 111.21, 111.31; 118/723 E, 723 R, 723 VE; 918/723 E, 72 E; 156/345; 204/298

(56) References Cited
U.S. PATENT DOCUMENTS

| 4,887,005 A | * 12/1989 | Rough et al. ........... 315/111.21 |
| 5,922,134 A | 7/1999 | Ohbuchi ............... 118/723 ER |
| 2002/0108712 A1 | * 8/2002 | Obuchi et al. ......... 156/345.43 |

FOREIGN PATENT DOCUMENTS

| JP | 05-502971 | 5/1993 |
| JP | 08-050996 | 2/1996 |
| JP | 08-088220 | 4/1996 |

* cited by examiner

Primary Examiner—Tuyet Thi Vo
(74) Attorney, Agent, or Firm—Carrier, Blackman & Associates, P.C.; Joseph P. Carrier; William D. Blackman

(57) ABSTRACT

A simultaneous discharge apparatus comprises a plurality of plasma treatment apparatuses and a single high-frequency power supply, in which the plurality of plasma treatment apparatuses are discharged simultaneously using the single high-frequency power supply, the plurality of plasma treatment apparatuses being a plasma treatment apparatus in which a coil electrode is used as an electrode for generating plasma and inductive coupled plasma is mainly generated, wherein a power supply line from the high-frequency power supply is branched into each plasma treatment apparatus through a branch section, and fixed capacitors are provided on the downstream side of the branch section and between the branch section and each plasma treatment apparatus, respectively. It is preferable to adjust the impedance of the fixed capacitor to be 2.3–2.7 times that of the coil electrode which is located on the same downstream side. With this, it is possible to conduct a treatment such as an etching process or an ashing process to a coating film formed on the surface of a material to be treated in each chamber at the same rate.

14 Claims, 2 Drawing Sheets

SIMULTANEOUS DISCHARGE APPARATUS

BACKGROUND OF THE INVENTION

1. Field of the Invention

The present invention relates to a simultaneous discharge apparatus in which a plurality of plasma treatment apparatuses are discharged simultaneously using a single high-frequency power supply.

2. Description of the Related Art

As a conventional apparatus for plasma treatment, there are two kinds of known apparatuses, i.e., a parallel planar apparatus in which a pair of electrodes are provided inside a chamber and a plasma treatment apparatus in which an antenna (electrode) for generating plasma is provided outside a chamber. As the latter apparatus, there are two known types, i.e., a type in which a pair of sheet-like electrodes are provided opposite to each other on the periphery of a chamber, whereby a high-frequency power supply is connected to one of the pair of sheet-like electrodes and the other is grounded, and a type in which a spiral or annular coil electrode is provided around a chamber and a high-frequency power supply is connected to the coil electrode.

Also, as an example of plasma which is generated by applying high frequency power to a plasma treatment apparatus with a high-frequency power supply, capacitive coupled plasma (CCP) and inductive coupled plasma (ICP) are known. In a plasma treatment apparatus in which sheet-like electrodes are used, capacitive coupled plasma is mainly generated. In a plasma treatment apparatus in which a coil electrode is used, inductive coupled plasma is mainly generated.

It has been acknowledged that inductive coupled plasma is preferable because capacitive coupled plasma causes damage to a substrate to be treated. Therefore, a plasma treatment apparatus in which a coil electrode is used and also capacitive coupled plasma is kept from being generated has been proposed in the related art materials such as Japanese Unexamined Patent Application Publication 5-502971, Japanese Unexamined Patent Application Publication 8-50996, and Japanese Unexamined Patent Application Publication 8-88220. In the apparatuses disclosed in these materials, a Faraday shield is provided between an antenna (coil electrode) and a chamber for plasma treatment, and capacitive coupled plasma is controlled by electrically short-circuiting an axial electric field of the antenna.

However, in the related art, there is a drawback as follows:

The related art has no disadvantage in a case where a single plasma treatment apparatus is discharged by using a single high-frequency power supply. However, in a case where a plurality of plasma treatment apparatuses are simultaneously discharged by using a single high-frequency power supply, since the wired state of wires such as an RF cable (power supply line) which constructs the coil electrode is slightly different between each chamber of each plasma treatment apparatus, a slight difference in impedance between each chamber will be caused. As a result of this, plasma is more easily generated in the chamber of low impedance and plasma is harder to be generated in the chamber of high impedance, which is a problem.

Therefore, the object of the present invention is to provide a simultaneous discharge device in which a plurality of plasma treatment apparatuses are discharged simultaneously using a single high-frequency power supply and thereby it is possible to conduct a treatment such as an etching process or an ashing process to a coating film formed on the surface of a material to be treated in each chamber at the same rate.

SUMMARY OF THE INVENTION

To solve the problem mentioned in the above, according to the present invention, there is provided a simultaneous discharge apparatus comprising a plurality of plasma treatment apparatuses and a single high-frequency power supply, wherein the plurality of plasma treatment apparatuses are discharged simultaneously using the single high-frequency power supply, each apparatus of the plurality of plasma treatment apparatuses including a coil electrode for generating plasma which is mainly inductive coupled plasma, and wherein a power supply line from the high-frequency power supply is branched into each plasma treatment apparatus through a branch section, and fixed capacitors are provided on the downstream side of the branch section and between the branch section and each plasma treatment apparatus, respectively. In this instance, it is preferable to adjust the impedance of the fixed capacitor to be 2.3–2.7 times that of the coil electrode which is located on the same downstream side.

By branching the power supply line from the high-frequency power supply into each plasma treatment apparatus through the branch section, it is possible to supply RF electric power to each plasma treatment apparatus at the same time.

By providing the fixed capacitor on the downstream side of the branch section and between the branch section and each plasma treatment apparatus and adjusting the impedance of the fixed capacitor to be 2.3–2.7 times that of the coil electrode which is located on the same downstream side, it is possible to simultaneously discharge the plurality of plasma treatment apparatuses using the single high-frequency power supply.

Also, in a case where the difference between the fixed capacitors is controlled within ±5 %, it is possible to equally distribute RF electric power to a chamber of each plasma treatment apparatus. In addition, in a case where the coil electrode for generating plasma is wound around the corresponding plasma treatment apparatus and a metal plate for fine-tuning is provided on the earth electrode side of the coil electrode for generating plasma, it is possible to make sure to simultaneously discharge the plurality of plasma treatment apparatuses.

According to the present invention, by simultaneously discharging the plurality of plasma treatment apparatuses, it is possible to simultaneously and equally conduct a treatment to a material to be treated in each chamber.

DETAILED DESCRIPTION OF THE PREFERRED EMBODIMENTS

Figure 1:
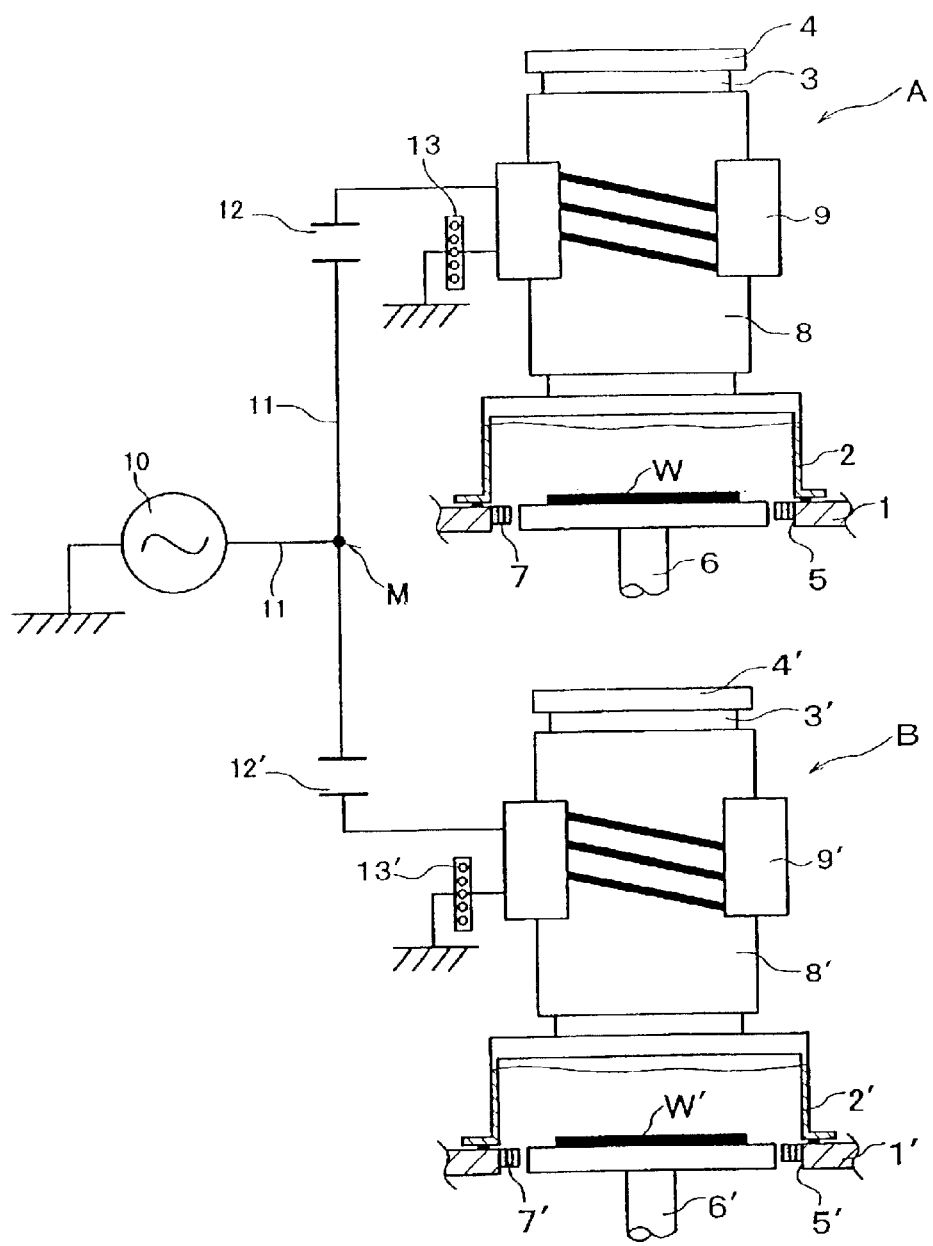
FIG. 1 is a schematic diagram of a simultaneous discharge apparatus according to the present invention.
Figure 2:
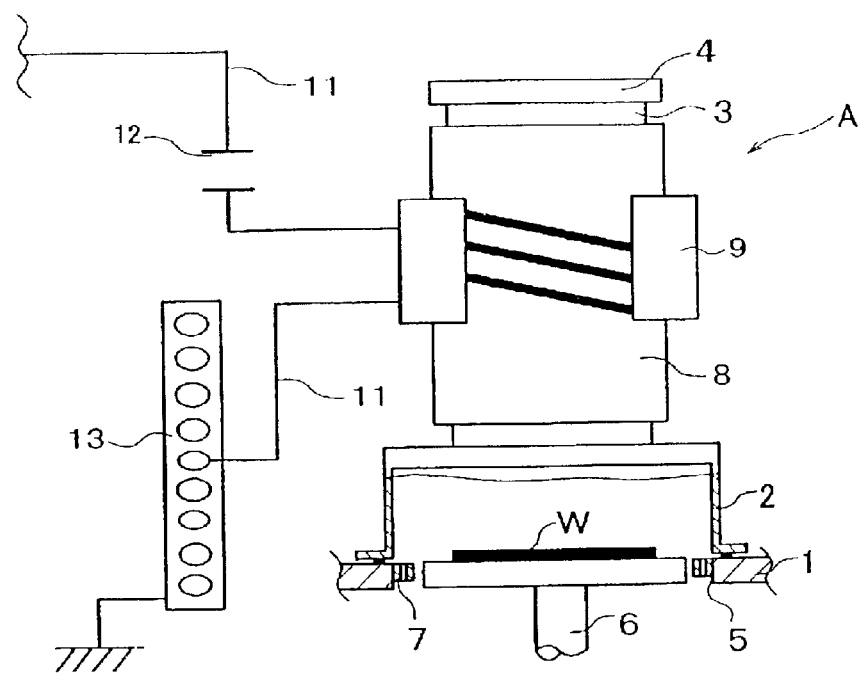
FIG. 2 is an enlarged sectional view of the plasma treatment apparatus shown in FIG. 1.

An embodiment of the invention will be described below. FIG. 1 is a schematic diagram of a simultaneous discharge apparatus according to the present invention, and FIG. 2 is an enlarged sectional view of one of the plasma treatment apparatuses shown in FIG. 1.

As shown in FIG. 1, inductive coupled plasma treatment apparatuses A and B are comprised of respectively bases 1 and 1', lower chambers 2 and 2' which are made of quartz or alumina ceramics and mounted on the bases respectively, upper chambers 3 and 3' which are made of quartz or alumina ceramics and mounted on the lower chambers respectively, and top plates 4 and 4' which have a flange and located on the upper chambers respectively. Reactive gas is introduced through the top plates 4 and 4'.

The lower chambers 2 and 2' are connected to the upper chambers 3 and 3' respectively. The lower chambers 2 and 2' function as a treatment area for materials to be treated W and W', and the upper chambers 3 and 3' function as a plasma-generated area.

The bases 1 and 1' have openings 5 and 5' respectively. Stages 6 and 6' face the openings 5 and 5' from below respectively. The stages 6 and 6' are allowed to be elevated and lowered with the material to be treated W and W' being mounted thereon. The stages 6 and 6' also have a heater therein. Exhaust rings 7 and 7' are provided on the inner periphery of the openings 5 and 5' respectively, and exhaust is conducted through holes which are formed in the exhaust rings 7 and 7' respectively. In this instance, it is preferable to apply insulation treatment to the exhaust rings 7 and 7' so as to prevent the generated plasma from scattering.

Faraday shields 8 and 8' of aluminum alloy having high magnetic permeability are provided outside the upper chamber 3 and 3' respectively, and coil electrodes 9 and 9' are wound around the outer periphery of the Faraday shields 8 and 8' three times respectively.

This embodiment is characterized in that a high-frequency power supply 10 is connected through a power supply line 11 (power supply cable). The frequency of the high-frequency power supply 10 is in the range of 400 KHz–27 MHz.

One end of the high-frequency power supply 10 is grounded, and the other is branched at a point M. The branched high-frequency power supply 10 is connected to solid capacitors (fixed capacitor) 12 and 12' respectively through the power supply line 11. The solid capacitors 12 and 12' are connected to the upper portions of the coil electrodes 9 and 9' respectively. The lower portions of the coil electrodes 9 and 9' are grounded through metal plates 13 and 13' respectively.

Once the impedance of the fixed capacitors 12 and 12' is determined, such impedance will not change greatly. In this embodiment, the impedance of the fixed capacitors 12 and 12' is adjusted to be 2.3–2.7 times that of the coil electrodes 9 and 9' which are located on the same downstream side.

In order to supply electric power from the high-frequency power supply 10 to the plasma treatment apparatuses A and B simultaneously and equally, it is necessary to provide the fixed capacitors 12 and 12'. However, since the impedance of the fixed capacitors 12 and 12' is constant, the flow of electric power is deviated depending on the magnitude of the impedance of the coil electrodes 9 and 9' which are apparently changed by generation of plasma.

The impedance of each plasma treatment apparatus A and B can be considered as the sum of the impedance of the fixed capacitor and the coil electrode which are located on the same side as the plasma treatment apparatus. Therefore, if the impedance of each capacitor is set to be a sufficiently great value with respect to the impedance of each coil electrode, it is possible to reduce the influence of the difference in impedance between coil electrodes from the viewpoint of the impedance of the entire plasma treatment apparatus A or B. However, in either case where the impedance of each fixed capacitor is too great or too small, it is impossible to conduct a secure and equal plasma treatment.

Thus, intensive research has been made, and it has been acknowledged that the plurality of plasma treatment apparatuses can simultaneously be discharged even if the impedance of the coil electrode is changed to a certain degree by adjusting the impedance of the fixed capacitor to be 2.3–2.7 times that of the coil electrode which is located on the same downstream side.

If the impedance of the fixed capacitor is less than 2.3 times that of the coil electrode, discharge occurs in only one of the plasma treatment apparatuses, and thus, simultaneous discharge cannot be attained. If the impedance of the fixed capacitor is greater than 2.7 times that of the coil electrode, the resistance of the capacitor itself becomes too great and the plasma efficiency is deteriorated, which is not preferable.

Even if simultaneous discharge can be achieved with respect to the plasma treatment apparatuses A and B, if the electric power distributed to the each of the plasma treatment apparatuses A and B is not equal, a difference will be caused in the rate of an ashing process or an etching process. For this purpose, in this embodiment, the difference between the fixed capacitors 12 and 12' is adjusted within ±5% (preferably within ±2%). By reducing the difference between the fixed capacitors, it becomes possible to distribute electric power more equally.

In order to enable more and more equal distribution of electric power, in this embodiment, the metal plates 13 and 13' for fine-tuning are provided on the earth side of the coil electrodes 9 and 9' respectively. FIG. 2 shows an enlarged view of the metal plate 13. An odd number of bores are formed in the metal plate 13, and the central bore is an initial set position. In either of the plasma treatment apparatuses which is inferior in the processing rate, the set position is shifted to the next bore in an extended direction. By shifting the set position one by one, it is possible to adjust the processing rate of each plasma treatment apparatus to be substantially the same.

In operation, the electric power from the high-frequency power supply 10 is branched at the branch point M, and each is applied to the plasma treatment apparatuses A and B through the fixed capacitors 12 and 12'. The axial electric field of the coil electrodes 9 and 9' is short-circuited by the Faraday shields 8 and 8'. As a result, generation of capacitive coupled plasma is controlled and mainly inductive coupled plasma is generated within the upper chambers 3 and 3'.

The generated inductive coupled plasma is introduced into the lower chambers 2 and 2' together with the reactive gas introduced through the top plates 4 and 4'. A desired treatment such as an ashing process or an etching process is conducted to the materials to be treated W and W' which are mounted on the stages 6 and 6' respectively.

As mentioned in the above, according to the present invention, since the power supply line from the high-frequency power supply is branched with respect to each plasma treatment apparatus through the branch section, it is possible to supply RF electric power to each plasma treatment apparatus at the same time. Also, since the fixed capacitor is provided on the downstream side of the branch section and between the branch section and each plasma treatment apparatus, and the impedance of the fixed capacitor is adjusted to be 2.3–2.7 times that of the coil electrode which is located on the same downstream side, it is possible to simultaneously discharge the plurality of plasma treatment apparatuses using the single high-frequency power supply.

Also, by controlling the difference between the fixed capacitors within ±5% it is possible to equally distribute RF electric power to a chamber of each plasma treatment apparatus. In addition, by winding the coil electrode for generating plasma around the plasma treatment apparatus and providing a metal plate for fine-tuning on the earth electrode side of the coil electrode for generating plasma, it is possible to make sure to simultaneously discharge the plurality of plasma treatment apparatuses.

By simultaneously discharging the plurality of plasma treatment apparatuses, it is possible to simultaneously and equally conduct a treatment to a material to be treated in the each chamber.

Although there has been described what is the present embodiment of the invention, it will be understood by persons skilled in the art that variations and modifications may be made thereto without departing from the spirit or essence of the invention. The scope of the invention is indicated by the appended claims.

What is claimed is:

1. A simultaneous discharge apparatus comprising:

a plurality of plasma treatment apparatuses; and a single high-frequency power supply, wherein said plurality of plasma treatment apparatuses are discharged simultaneously using said single high-frequency power supply, each apparatus of said plurality of plasma treatment apparatuses including a coil electrode for generating plasma which is mainly inductive coupled plasma, and wherein a power supply line from said high-frequency power supply is branched into each plasma treatment apparatus through a branch section, and a fixed capacitor are provided on the downstream side of said branch section and between said branch section and each said plasma treatment apparatus, respectively.

2. The simultaneous discharge apparatus according to claim 1, wherein the impedance of each said fixed capacitor is adjusted to be 2.3–2.7 times that of said coil electrode which is located on the same downstream side.

3. The simultaneous discharge apparatus according to claim 1, wherein a difference between the fixed capacitors is controlled within ±5%.

4. The simultaneous discharge apparatus according to claim 1, wherein each said coil electrode for generating plasma is wound around the corresponding plasma treatment apparatus and a metal plate for fine-tuning is provided on a earth electrode side of said coil electrode for generating plasma.

5. The simultaneous discharge apparatus according to claim 1, wherein each said plasma treatment apparatus further includes a Faraday shield.

6. The simultaneous discharge apparatus according to claim 1, wherein a difference between the fixed capacitors is controlled within ±2%.

7. A simultaneous discharge apparatus comprising:

a plurality of plasma treatment apparatuses; and a single high-frequency power supply, wherein said plurality of plasma treatment apparatuses are discharged simultaneously using said single high-frequency power supply, each apparatus of said plurality of plasma treatment apparatuses including a coil electrode for generating plasma which is mainly inductive coupled plasma, wherein a power supply line from said high-frequency power supply is branched into each plasma treatment apparatus through a branch section, and fixed capacitors are provided on the downstream side of said branch section and between said branch section and each said plasma treatment apparatus, respectively, and wherein the impedance of each said fixed capacitor is adjusted to be 2.3–2.7 times that of said coil electrode which is located on the same downstream side.

8. A simultaneous discharge apparatus comprising:

a plurality of plasma treatment apparatuses; and a single high-frequency power supply, wherein said plurality of plasma treatment apparatuses are discharged simultaneously using said single high-frequency power supply, each apparatus of said plurality of plasma treatment apparatuses including a coil electrode for generating plasma which is mainly inductive coupled plasma, wherein a power supply line from said high-frequency power supply is branched into each plasma treatment apparatus through a branch section, and fixed capacitors are provided on the downstream side of said branch section and between said branch section and each said plasma treatment apparatus, respectively, and wherein a difference between the fixed capacitors is controlled within ±5%.

9. A simultaneous discharge apparatus comprising:

a plurality of plasma treatment apparatuses; and a single high-frequency power supply, wherein said plurality of plasma treatment apparatuses are discharged simultaneously using said single high-frequency power supply, each apparatus of said plurality of plasma treatment apparatuses including a coil electrode for generating plasma which is mainly inductive coupled plasma, wherein a power supply line from said high-frequency power supply is branched into each plasma treatment apparatus through a branch section, and fixed capacitors are provided on the downstream side of said branch section and between said branch section and each said plasma treatment apparatus, respectively, and wherein each said coil electrode for generating plasma is wound around the corresponding plasma treatment apparatus and a metal plate for fine-tuning is provided on an earth electrode side of said coil electrode for generating plasma.

10. The simultaneous discharge apparatus according to claim 9, wherein each said metal plate includes multiple preset portions to be connected to the earth electrode side of said coil electrode.

11. The simultaneous discharge apparatus according to claim 10, wherein and said earth electrode side of each said coil electrode is adapted to be selectively connected to different ones of said preset portions of the corresponding metal plate to adjust a processing rate of said plasma treatment apparatus.

12. A simultaneous discharge apparatus comprising:

a plurality of plasma treatment apparatuses; and a single high-frequency power supply, wherein said plurality of plasma treatment apparatuses are discharged simultaneously using said single high-frequency power supply, each apparatus of said plurality of plasma treatment apparatuses including a coil electrode for generating plasma which is mainly inductive coupled plasma, wherein a power supply line from said high-frequency power supply is branched into each plasma treatment apparatus through a branch section, and fixed capacitors are provided on the downstream side of said branch section and between said branch section and each said plasma treatment apparatus, respectively, and wherein a difference between the fixed capacitors controlled within ±2%.

13. A simultaneous discharge apparatus comprising a single high frequency power supply, plural plasma treatment apparatuses, wherein each of said plural plasma treatment apparatuses are discharged simultaneously using the single high frequency power supply, wherein a power supply line from the single high frequency power supply is branched into each of said plural plasma treatment apparatuses through a branch section, wherein a fixed capacitor is provided in each branch section such that it lies between the branch section and each of said plasma treatment apparatuses, respectively, wherein each of said plural plasma treatment apparatuses is surrounded by a coil electrode, and wherein each of said plural plasma treatment apparatuses generates mainly inductive coupled plasma.

14. The simultaneous discharge apparatus of claim 13 wherein the fixed capacitors minimize the any influence of any difference of impedance of the coil electrodes on the discharge of each of said plural plasma treatment apparatuses.

* * * * *

UNITED STATES PATENT AND TRADEMARK OFFICE
CERTIFICATE OF CORRECTION

PATENT NO.    : 6,836,073 B2
DATED         : December 28, 2004
INVENTOR(S)   : Matsushita It is certified that error appears in the above-identified patent and that said Letters Patent is hereby corrected as shown below:

Column 5,
Line 31, change "and a fixed" to -- and fixed --;
Line 32, change "tor are provided" to -- tors are provided --.
Lines 35-53, cancel claims 2, 3, 4, and 6 because they are identical to claims 7, 8, 9, and 12 respectively.

Column 6,
Line 50, change "wherein and said" to -- wherein said --.

Column 8,
Line 10, change "minimize the any influence" to -- minimize any influence --.

Signed and Sealed this

Seventeenth Day of May, 2005

JON W. DUDAS
*Director of the United States Patent and Trademark Office*